United States Patent [19]

Yamauchi et al.

[11] Patent Number: 4,906,609
[45] Date of Patent: Mar. 6, 1990

[54] FABRICATION OF SUPERCONDUCTING OXIDE WIRES BY POWDER-IN-TUBE METHOD

[75] Inventors: Kazuhisa Yamauchi; Kazuya Ohmatsu, both of Osaka; Tetsuya Ishida, Itami; Tomoji Gotoh, Itami; Syuji Yazu, Itami; Tetsuji Jodai, Itami, all of Japan

[73] Assignee: Sumitomo Electric Inc. Ltd., Osaka, Japan

[21] Appl. No.: 175,794

[22] Filed: Mar. 31, 1988

[30] Foreign Application Priority Data

Mar. 31, 1987 [JP] Japan .................................. 62-80028
Oct. 9, 1987 [JP] Japan .................................. 62-254969

[51] Int. Cl.$^4$ .......................... H01L 39/24; H01B 5/02
[52] U.S. Cl. ........................................... 505/1; 427/62; 427/63; 29/599; 29/33 F; 29/33 D; 174/125.1; 505/740
[58] Field of Search ....................... 427/62, 63; 29/599, 29/825, 828, 33 F, 33 D; 505/1, 818, 821, 823; 174/125.1

[56] References Cited

U.S. PATENT DOCUMENTS

| | | | |
|---|---|---|---|
| 3,471,925 | 10/1969 | Bindari | 29/599 |
| 3,708,606 | 1/1973 | Shattes et al. | |
| 4,223,434 | 9/1980 | Wang et al. | 29/599 |
| 4,313,247 | 2/1982 | Stuttard | 29/828 |

OTHER PUBLICATIONS

"Superconductivity at 93K in a New Mixed-Phase Y-Ba-Cu-O Compound System at Ambient Pressure", vol. 58, No. 9, M. K. Wu et al., pp. 908-910, 2 Mar. 1987, Physical Review Letters.

"High $T_c$ Superconductivity of La-Bu-Cu Oxides", Shin-ichi Uchida et al., Japanese Journal of Applied Physics, vol. 26, No. 1, Jan. 1987, pp. L1-L2.

"Possible High $T_c$ Superconductivity in the Ba-La-Cu-O System", J. G. Bednorz and K. A. Muller, Z. Phys. B-Condensed Matter 64, pp. 189-193 (1986).

McCallum et al., "Problems in the Production of Y $Ba_2Cu_3O_x$ Superconducting Wire", Advanced Ceramic Materials, 2, 3B, Jul. 1987, pp. 388-400.

Tsukuba et al., "Asahi Newspaper", 3/10/1987.

Cava et al., "Bulk Superconductivity at 36K in $La_{1.8}Sr_{0.2}CuO_4$", Phys. Rev. Lett., vol. 58, No. 4 (1987) pp. 408-410.

Hattangadi, "How to Set a Periodic Table", Industrial Chemistry, May 1988, p. 20.

Primary Examiner—Norman Morgenstern
Assistant Examiner—Roy V. King
Attorney, Agent, or Firm—Pennie & Edmonds

[57] ABSTRACT

A powder-in-tube method of producing an oxide superconduction wire is disclosed in which a preformed copper oxide superconducting powder is continuously filled into a tube precursor having a U shape cross-section formed from a long strip of metal material. The tube precursor is formed into a tube by bending and welding. The resulting tube is drawn to a reduced cross-section and further heated to sinter the packed powder to form the finished oxide superconducting wire.

20 Claims, 1 Drawing Sheet

FABRICATION OF SUPERCONDUCTING OXIDE WIRES BY POWDER-IN-TUBE METHOD

SPECIFICATION

Field of the Invention

The present invention relates to a method of producing a superconducting member, in particular to a method of producing a superconducting wire, more particularly a superconducting wire consisting of a normal conductor and a superconductor having a high critical temperature.

Prior Art and Problems to be Solved

Superconductors exhibit complete diamagnetism and zero voltage drop along their length, even though a definite current passes through the conductor. Various applications of superconductors as a lossless transmission medium for electric power have been proposed.

Possible applications include MHD generation of electricity, transmission and storage of electric power, magnetic levitation of trains and electro-magnetic ship propulsion, and various uses in instrumentation, such as NMR, pi-meson sources for medical treatment, and supersensitive sensors for magnetic fields, microwaves, radio-active beams and the like.

In addition, superconductors are capable not only of reducing consumption of electric power but also being used as remarkable speedy switching elements, e.g. Josephson junction devices.

Until recently, superconductivity had been observed only at extremely low temperatures. That is to say, the remarkably low temperature of 23.2K had been the highest superconducting critical temperature Tc observed, that of $Nb_3Ge$.

Accordingly, prior superconducting materials had required liquid helium coolant having a boiling point of 4.2K to realize the superconducting phenomenon. However, the use of liquid helium involves remarkable technical and cost burdens, and thus the practical realization of superconducting techniques has been hindered.

It has, however, been recently reported that a sintered body comprising oxides of elements of groups IIa or IIIa of the periodic table can be a superconductor having a remarkably high Tc, and thus use of superconducting devices using high temperature superconductors is expected to increase rapidly. Composite oxides having a so-called pseudo-perovskite type crystalline structure such as $[La, Ba]_2CuO_4$ or $[La, Sr]_2CuO_4$, which seem to have an orthorhombic structure and the like similar to the crystalline structure of perovskite type oxides, have been already reported. Tc of 30 to 50K, remarkably high in comparison with those of the conventional superconducting materials, have been observed for these substances. In addition, Tc of 70 K or more has been reported for superconducting materials formed of oxides of Ba, Y and Cu.

However, since these superconducting materials are obtained in the form of sintered bodies, that is, because they are produced by sintering molded products, methods of continuously producing long objects, such as wires, have not been developed. In addition, superconductors formed as sintered bodies are remarkably fragile, so that the superconducting material is difficult to mold in many cases.

A method, in which the superconducting wire is produced and then coated with a normal conductors, has been employed to produce a composite wire consisting of the normal conductor and the superconductor.

However, this method is not efficient.

Thus, it is an object of the present invention to solve the above described problems of the prior art, providing a novel method of continuously producing a superconducting material having a high Tc in the form of a wire which is highly stable in superconducting characteristics, and having useful mechanical properties.

It is another object of the present invention to provide a method of producing a composite wire comprising a superconductor and a normal conductor in a single step.

SUMMARY OF THE INVENTION

In order to achieve the first object mentioned above, the present invention provides a method of producing a superconducting wire, comprising the steps of continuously forming a strip of material into a U-shaped strip; filling this with raw material powders; closing up the U-shaped strip, forming a tube; butt welding the resulting seam; and sintering the resulting tube with the raw material powders housed therein.

According to the preferred embodiment of the present invention, the raw material powders preferably include mixture of oxides, nitrides, fluorides, carbonates, nitrates, oxalates or sulfates of one element $\alpha$ selected from group IIa in the periodic table, one element $\beta$ selected from group IIIa in the periodic table and one element $\gamma$ selected from groups Ib, IIb, IIIb, IVa and VIIIa in the periodic table, or powders of composite oxides obtained by sintering these materials and pulverizing them.

In addition, in order to achieve another object of the present invention, a strip of metal is continuously formed into a flume-like shape and the resulting concave member is filled with the oxide superconducting material. Subsequently, the conductor is closed further, but leaving a gap between the opposed edges thereof, to envelop said material, followed by sintering and then forming the wire to the desired final shape and size.

DESCRIPTION OF THE PREFERRED EMBODIMENTS

Figure 1A:
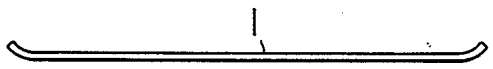
FIG. 1(a) to (e) are schematic diagrams showing the steps in production of the superconducting material according to Example 1 of the present invention.

The method of producing a superconducting material according to the present invention comprises a series of steps which may be performed as a continuous process. In other words, according to the present invention, the process can be continuously carried out by simultaneously forming the strip material into a tube and supplying the raw material powders.

The metallic tube is preferably an electric welded tube. This step, as discussed in detail below, is carried out by first forming the strip material into a U-shaped tube precursor, closing up the tube and welding the opposed butt edges. In these steps, the tube is closed by seam welding after it has been filled with the raw material powders. Subsequently, the thin wire-like tube can be sintered to produce a superconducting wire by heat treatment of the tube with the raw material powders housed therein.

The method of the present invention can be continuously carried out, so that an elongated member, such as a conductor for electric power transmission can be advantageously produced.

Conventional techniques accumulated in the production of electric welded tubes can be applied to the practice of the invention; for example, the plate material can be formed into a tube having a C-shaped cross-section (by the use of a crimping press) before it is formed to the U-shaped cross-section, and the opposed butt surfaces may be ground to expose activated surfaces.

In addition, some materials, of which the superconductor may desirably be formed, react chemically with the composite oxide superconducting materials. In this case, it is preferable that the surface of the strip is subjected to a surface treatment, for example it can be coated with a non-reactive material.

The superconducting wire produced according to the present invention comprises a sintered core with a sheath, the core having the superior superconducting characteristics provided by composite oxide sintered bodies. The sheath functions as a support member, so that the superconducting wire produced according to the present invention has high mechanism strength. In addition, if the sheath is formed of a normal conductor, it functions as a current shunt and a heat-radiating surface if the superconductor is quenched.

In view of these working methods and the desired characteristics, the strip may be formed of a metal selected from the group consisting of stainless steel, Cu, Ag, Au, Pt, Pd, Rh, Fe, Pb, Sn, Cd, Ti, W, Mo, Zr, Hf, Ta and Nb or alloys thereof or others. Of these, Cu, Fe and the like are advantageous in easy workability and inexpensiveness, stainless steel and Pt are advantageous in chemical stability, so that the sheath does not react with the superconducting material, and Ag, Pd, Rh and the like are advantageous as the sheath member of the superconducting material, in cases where the oxygen-concentration must be controlled, since some of these oxides emit oxygen upon heating. The material of the sheath should be suitably selected depending upon the superconducting material desired and the like.

In addition, the method according to the present invention can be widely used as a method of producing long sintered products, in particular composite oxide sintered bodies, expressed by the general formula $\alpha_w \beta_x \gamma_y \delta_z$, wherein the element $\alpha$ is selected from the group IIa in the periodic table; element $\beta$ is selected from group IIIa in the periodic table; element $\{$ is selected from groups Ib, IIb, IIIb and VIII in the periodic table; $\delta$ being 0; and w, x, y, and z being as follows: $1 \leq w \leq 5$, $1 \leq x \leq 5$, $1 \leq y \leq 15$ and $1 \leq z \leq 20$. In addition, said composite oxides include in particular composite oxides, such as Ba-Y-Cu, Ba-Ho-Cu, Sr-La-Cu or Ba-Dy-Cu, exhibiting particularly superior characteristics. These composite oxides seem to have a so-called pseudo-perovskite type crystalline structure including oxygen vacancies such as an orthorhombic structure. Such superconducting materials can be effectively used for transmission of electric power and the like by forming them as a long superconductor according to the present invention.

It is desired that the sintering temperature is between 0° and 100° C. less than the lowest melting point of any constituent of the sintered body. If the sintering temperature is lower than the above described range, the sintering reaction is not completed and the strength of the resulting sintered body is extraordinarily reduced; while if the sintering temperature exceeds the above described range, a liquid phase is produced during the sintering step which leads to the melting or decomposition of the sintered body, remarkably lowering the Tc of the sintered body.

In addition, according to the discovery by the present inventors, the addition of powdered oxides, carbonated, sulfates or nitrates of at least one kind of element selected from the group consisting of V, Nb, Ta, Mo, W, Ti, Cr, Mn, Ga, In, Cd, Sn, Tl, Pb and Zn to the element $\gamma$ at an atomic ratio of about 0.01 to 0.15 leads to superior superconducting characteristics.

It is preferable that the raw material powders have a particle diameter of 10 microns or less. The pulverization of the raw material powders promotes effective sintering, and the uniform structure and increase of the intercrystalline surface area play an important function of the superconducting characteristics.

The present invention is described below with reference to the preferred embodiments, but the following preferred embodiments are merely illustrative. The scope of the present invention is not limited by them.

EXAMPLE 1

At first, a Cu strip 1 was formed into a tube having a C-shaped section, as shown in FIG. 1(a), and then heated in air to oxidize the surface thereof. Then the long edges of the strip 1 were ground to expose activated surfaces and adjust the shape of the end surfaces. Although only the long edges of the strip 1 were ground in the present preferred embodiment, the end surfaces also may be ground and an endless tube produced by connecting the strips to one another in turn.

Figure 1B:
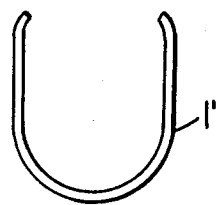
Figure 1C:
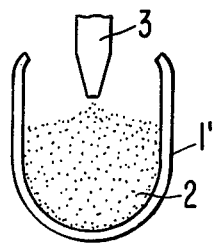

Successively, this strip was turned into a tube 1' having a U-shaped section by means of a forming roll, as shown in FIG. 1(b). Then, the inside of the tube 1' having a U-shaped section was continuously supplied with the raw material powders 2 through the nozzle 3, as shown in FIG. 1(c).

The raw material powders 2 supplied here were powders of composite oxide sintered bodies obtained by first sintering a mixture comprising powders of $BaCO_3$, $Y_2O_3$ and CuO having the purity of 3N or more and an average particle diameter of 5 microns or less, so that the composition after sintering (e.g. in air at 900° C. for 24 hours) may become $Ba_2YCu_3O_7$, and then pulverizing the resulting caked powders to 4 microns in a ball mill made of high purity zirconia, and repeating this process further three times.

Figure 1D:
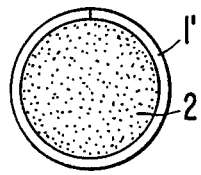

Next, the pipe 1' having a U-shaped section with the raw material powders 2 housed therein was turned into a pipe having an O-shaped section by means of a forming roll and the butt surfaces were TIG welded to obtain the Cu pipe 1' with the raw material powders housed therein, as shown in FIG. 1(d).

Figure 1E:
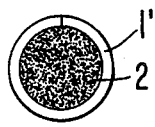

Subsequently, the Cu pipe 1' with the raw material powders housed therein was reduced in diameter and drawn by means of a die disposed in tandem to the forming roll line, as shown in FIG. 1(e).

Five samples, each 1 m long, numbered 1–5 were prepared.

A further quantity of the above described wire was subjected to intermediate annealing in an atmosphere of $N_2$ gas at 700° C. for 1 hour and then drawn further in a reducing die to obtain a wire. This resulting wire was cut into five samples, each 1 m long and numbered 6–10.

Samples 1–10 were subjected to heat treatments under the conditions shown in the following Table 1 to obtain products.

Although the samples all were heated in an atmosphere of $N_2$ gas at 900° C., the heating times were changed as shown. In addition, samples 4–9 were heated and cooled and then heated at 700° C. for 10 hours again followed by cooling at a rate of 10° C./min. In addition, the samples 5 and 10 were heated also at 700° C. for 10 hours and then cooled at a rate of 50° C./min.

The superconducting characteristics of each sample are shown in Table 1.

TABLE 1

| Sample No. | Heating Time (Hr) | Tc (K) | Tci (K) |
| --- | --- | --- | --- |
| 1 | 0.5 | 89 | 67 |
| 2 | 6 | 87 | 72 |
| 3 | 12 | 89 | 84 |
| 4 | 12 | 91 | 82 |
| 5 | 12 | 90 | 83 |
| 6 | 0.5 | 86 | 73 |
| 7 | 6 | 88 | 79 |
| 8 | 12 | 95 | 91 |
| 9 | 12 | 94 | 89 |
| 10 | 12 | 97 | 93 |

The critical temperature Tc and the temperature Tci, at which the electric resistance becomes completely zero, were measured by the direct current four-probe method in a cryostat. Electrodes were connected to both ends of the samples with an electrically conductive Ag paste according to the usual method. The temperature was measured by means of a calibrated Au(Fe)-Ag thermocouple. The change in resistance was observed while increasing the temperature slowly.

EXAMPLE 2

Figure 2:
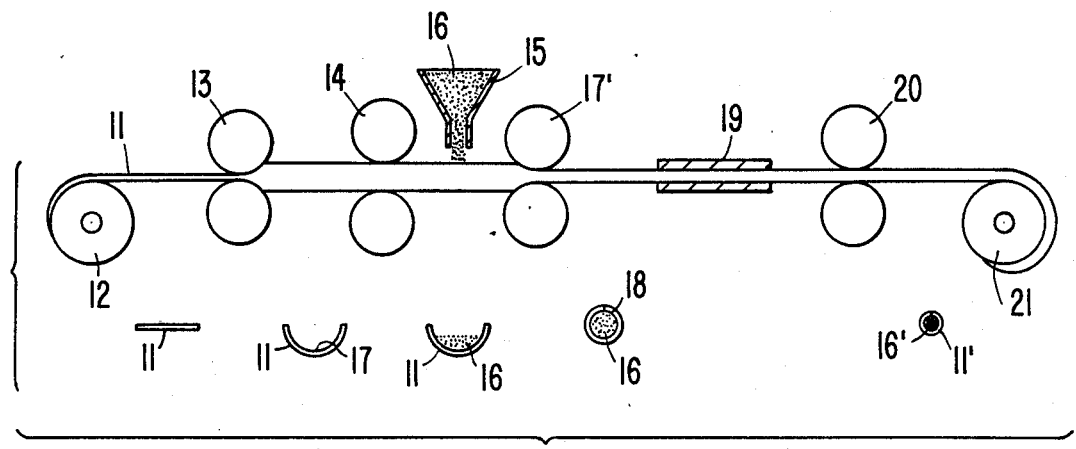
FIG. 2 is a schematic diagram showing the method of producing the superconducting wire according to Example 2 of the present invention.

As shown in FIG. 2, a strip of copper 11 is continuously drawn from a reel 12 and passed over forming rolls 13 and 14 to bend the copper strip 11 into a flume-like shape.

After passing over the forming rolls 13 and 14, the bent concave portion 17 of the copper strip 11 is filled with powdered oxide superconducting materials 16 from a feeder 15.

Subsequently, the copper strip is further formed in a forming roll 17' so that the edges approach each other to envelop said materials 16, while leaving a slight gap 18. This gap 18, which does not allow the materials 16 to escape, allows oxygen to reach the materials 16 housed in the copper strip in the subsequent sintering step.

This product is sintered in a furnace 19 in oxygen. After sintering, the copper wire 11 is passed over a roll 20 to draw the sintered bodies until the desired diameter is reached, followed by coiling on a reel 21.

In addition, in order to completely turn the sintered bodies 16' housed in said copper tube 11' into a solid solution, the copper tube 11' housing the sintered bodies 16' may be subjected to an additional heat treatment before it is coiled on the reel 21.

Although powdery oxide superconducting materials are used in the above described EXAMPLE, molten oxide superconducting materials may be poured into the concave strip and chilled to solidify it.

In addition, aluminum, silver or alloys thereof can be used as the conductive sheath, instead of copper. The oxide superconducting material may comprise Ca, Ba, or Sr, with one of Y, Sc and the lanthanide series elements, one of Cu, Ag and Au and one of O, F, N and C.

EXAMPLE 3

A stainless steel strip having a width of 25 mm, a length of 1,000 mm and a thickness of 1 mm was bent to form a flume having a U-shaped section, with a gap of 5 mm between its opposed edges.

A mixture comprising powders of $Bi_2O_3$, $SrCO_3$, $CaCO_3$ and CuO having an average particle diameter of 5 microns or less, so that the composition may become $Bi_4Sr_3Ca_3Cu_4O_x$ after the baking process, was preliminarily baked in air at 800° C. for 5 hours and then cooled, followed by melting at 1,100° C. in a platinum crucible.

The flume of U-shaped section was closed at both ends and then heated to 800° C., and the molten mixture was placed inside.

Subsequently, the flume was subjected to a heat treatment at 840° C. in air for 5 hours.

The critical temperature of the resulting heat treated product was measured by the same method as in EXAMPLE 1 with the results that Tc was 121 K and Tci was 80 K. In addition, no gap between the flume and the superconductor appeared even after its temperature was cycled between room temperature and that of liquid nitrogen 100 times.

As described above in detail, according to the present invention, a long composite oxide superconducting member having a high critical temperature can be continuously produced. Thus, the superconducting member can be actually utilized for transmission of electric power and the like. In addition, a long superconducting product produced according to the present invention has a metallic sheath member therearound, so that the metallic sheath member functions as a mechanical support member and as a shunt path for electric current when the superconductor is quenched.

In addition, after forming the strip into a flume-shape and supply of the oxide superconducting materials, the product can be sintered while a minute gap is left between the edges of the strip, so that the concentration of oxygen supplied can be adjusted.

Finally, according to the present invention, a composite wire comprising a normal conductor and a superconductor can be produced in a single continuous process.

What is claimed is:

1. A method of producing a superconducting wire, comprising the steps of:
   continuously forming a long strip of material into a tube precursor having a U-shaped section;
   continuously filling the interior of the resulting tube precursor with powder of a copper oxide superconductive ceramic material;
   forming the tube precursor of U-shaped section into a tube having an O-shaped section and welding together opposed butted edge portions of said strip material, to form a tube;
   drawing the resulting tube having the powder enclosed therein to a reduced cross-section; and
   heating the resulting assembly to sinter said powders.

2. A method of producing a superconducting wire as set forth in claim 1, characterized by that said powder of a copper oxide superconductive ceramic material is formed by sintering a mixture of powders comprising oxides, nitrides, fluorides, carbonates, nitrates, oxalates or sulfates of one kind of element α selected from elements of Mg, Ca, Sr and Ba in, one kind of element β selected from elements of Sc, Y, La, and Lanthanides, copper and powders of composite oxides obtained by baking mixtures of said elements and pulverizing them.

3. A method of producing a superconducting wire as set forth in claim 1, characterized by that said strip material is formed into a tube precursor of C-shaped section before it is formed into said tube precursor of U-shaped section.

4. A method of producing a superconducting wire as set forth in claim 1, characterized by that at least an inner surface of said strip material is subjected to a surface treatment prior to said first forming step.

5. A method of producing a superconducting wire as set forth in claim 4, characterized by that said surface treatment is a treatment for forming an oxidized film on a surface of said strip material.

6. A method of producing a superconducting wire as set forth in claim 1, characterized by that said strip material is formed into a tube precursor of U-shaped section by means of a forming roll.

7. A method of producing a superconducting wire as set forth in claim 1, characterized in that said edge portions of the strip material are subjected to a grinding operation to expose an activated surface prior to said welding step.

8. A method of producing a superconducting wire as set forth in claim 1, characterized by that said welding step is carried out by TIG welding.

9. A method of producing a superconducting wire as set forth in claim 8, characterized by that said TIG welding is carried out in an atmosphere of $N_2$ gas 10. A method of producing a superconducting wire as set forth in claim 1, characterized by that said drawing step is carried out by means of a reducing die.

11. A method of producing a superconducting wire as set forth in claim 10, characterized by that the drawing process is carried out plural times repeatedly at a reduction in area of 30% or less.

12. A method of producing a superconducting wire as set forth in claim 1, characterized by that said strip material is formed of a metal selected from the group consisting of stainless steel, Cu, Ag, Au, Pt, Pd, Rh, Fe, Pb, Sn, Cd, Ti, W, Mo, Zr, Hf, Ta, and Nb or alloys thereof.

13. A method of producing a superconducting wire as set forth in claim 1, characterized by that powders of oxides, carbonates, sulfates or nitrates of at least one metal selected from the group consisting of V, Nb, Ta, Mo, W, Ti, Cr, Mn, Ga, In, Cd, Sn, Tl, Pb and Zn are additionally added to said raw material powders as additives.

14. A method of producing a superconducting wire as set forth in claim 13, characterized by that said additives are added at an atomic ratio of 0.01 to 0.15 based on one mol of said element.

15. A method of producing a superconducting wire as set forth in claim 1, characterized in that said powders have particle diameters of 30 microns or less.

16. A method of producing a superconducting wire as set forth in claim 1, characterized by that the sintering is carried out at a temperature between 0° and 100° C. less than the melting point of the material having the lowest melting point of said raw material powders.

17. A method of producing a superconducting wire as set forth in claim 1, characterized by that the sintered powders are gradually cooled at a rate of 15° C./min or less after said sintering step.

18. A method of producing a superconducting wire as set forth in claim 2, characterized in that said element α is Ba and said element β is Y.

19. A method of producing a superconducting wire as set forth in claim 2, characterized by that said element α is Ba and said element β is Ho.

20. A method of producing a superconducting wire as set forth in claim 2, characterized by that said element α is Ba and said element β is Dy.

* * * * *